(12) United States Patent
Wu et al.

(10) Patent No.: US 11,335,568 B2
(45) Date of Patent: May 17, 2022

(54) METHOD FOR FORMING SEMICONDUCTOR STRUCTURE

(71) Applicant: Winbond Electronics Corp., Taichung (TW)

(72) Inventors: Ting-Wei Wu, Xiushui Township, Changhua County (TW); Cheng-Ta Yang, Kaohsiung (TW); Hsin-Hung Chou, Changhua (TW)

(73) Assignee: WINBOND ELECTRONICS CORP., Taichung (TW)

(*) Notice: Subject to any disclaimer, the term of this patent is extended or adjusted under 35 U.S.C. 154(b) by 55 days.

(21) Appl. No.: 16/872,760

(22) Filed: May 12, 2020

(65) Prior Publication Data
US 2021/0358764 A1 Nov. 18, 2021

(51) Int. Cl.
*H01L 21/3213* (2006.01)
*H01L 21/311* (2006.01)
*H01L 21/033* (2006.01)

(52) U.S. Cl.
CPC .... *H01L 21/32139* (2013.01); *H01L 21/0337* (2013.01); *H01L 21/31111* (2013.01); *H01L 21/31144* (2013.01)

(58) Field of Classification Search
None
See application file for complete search history.

(56) References Cited

U.S. PATENT DOCUMENTS

| | | | | |
|---|---|---|---|---|
| 7,687,387 | B2 * | 3/2010 | Inaba | H01L 27/11526 438/585 |
| 7,914,973 | B2 | 3/2011 | Ryou et al. | |
| 7,968,467 | B2 | 6/2011 | Choi | |
| 8,232,212 | B2 | 7/2012 | Davis et al. | |
| 8,288,293 | B2 * | 10/2012 | Pham | H01L 27/11548 438/775 |
| 9,324,574 | B2 * | 4/2016 | Kang | H01L 21/0337 |
| 9,455,194 | B1 * | 9/2016 | Feng | H01L 21/823412 |
| 10,224,213 | B2 * | 3/2019 | Byun | H01L 21/0337 |
| 2008/0248622 | A1 * | 10/2008 | Matamis | H01L 27/11543 438/261 |
| 2008/0280431 | A1 | 11/2008 | Jung et al. | |
| 2009/0117739 | A1 * | 5/2009 | Shin | H01L 27/10894 438/690 |
| 2010/0270608 | A1 * | 10/2010 | Pham | H01L 27/11548 257/324 |

(Continued)

*Primary Examiner* — Allan W. Olsen
(74) *Attorney, Agent, or Firm* — Muncy, Geissler, Olds & Lowe, PC (57) ABSTRACT

A method for forming a semiconductor structure is provided. The method includes: forming first and second hard mask layers and a target layer on a substrate; patterning the second hard mask layer to form patterned second hard masks including a second wide mask and second narrow masks; and forming spacers on sidewalls of the second wide mask and the second narrow masks. Then, a photoresist layer is formed to cover the second wide mask and the spacers on the sidewalls of the second wide mask. The second narrow masks and the photoresist layer are removed. And, the first hard mask layer is etched with the spacers and the second wide mask together as a mask to form patterned first hard masks on the target layer, wherein the spacers define a first line width, and the second wide mask and the pair of spacers define a second line width.

10 Claims, 10 Drawing Sheets

(56) References Cited

U.S. PATENT DOCUMENTS

| | | | |
|---|---|---|---|
| 2015/0255304 A1* | 9/2015 | Kang | H01L 21/32139 |
| | | | 438/696 |
| 2016/0365311 A1 | 12/2016 | Hung et al. | |
| 2017/0004973 A1* | 1/2017 | Kim | H01L 27/10897 |
| 2017/0221755 A1 | 8/2017 | Sim et al. | |

* cited by examiner

METHOD FOR FORMING SEMICONDUCTOR STRUCTURE

TECHNICAL FIELD

The present invention relates to a method for forming a semiconductor structure, and, in particular, to a method for forming the semiconductor structure of a flash memory.

BACKGROUND

The current manufacturing technology of memory devices keeps working on microminiaturization of the component size, in order to increase a density of components in the flash memory device and improve its overall performance.

However, as component sizes continue to decrease, many challenges arise. For example, during a semiconductor manufacturing process, a patterned mask layer defining a component in a target layer is often formed by lithography and etching processes. But, when forming a small-sized semiconductor structure, problems caused by multilayer photoresist layers, such as an overlay shift in the lithography process and scattering of the ion beam used in etching, can easily occur, resulting in the structure of the defined component being smaller than expected.

SUMMARY

An embodiment of the disclosure provides a method for forming a semiconductor structure. A target layer is formed on a substrate. A hard mask stack is formed on the target layer, wherein the hard mask stack includes a first hard mask layer and a second hard mask layer sequentially formed on the target layer. The second hard mask layer is patterned to form a plurality of patterned second hard masks, wherein the plurality of patterned second hard masks include a second wide mask and second narrow masks. A plurality of spacers is formed on sidewalls of the second wide mask and the second narrow masks. A photoresist layer is formed to cover a top surface of the second wide mask. The photoresist layer covers side surfaces of a pair of spacers on the sidewalls of the second wide mask. The second narrow masks between the neighboring spacers are removed by an etching process. The photoresist layer is removed. Then, the first hard mask layer is etched with the plurality of spacers and the second wide mask together as an etching mask to form a plurality of patterned first hard masks on the target layer, wherein the plurality of spacers are used to define a first line width, and the second wide mask and the pair of spacers formed on the sidewalls of the second wide mask are used together to define a second line width.

DETAILED DESCRIPTION

Figure 1:
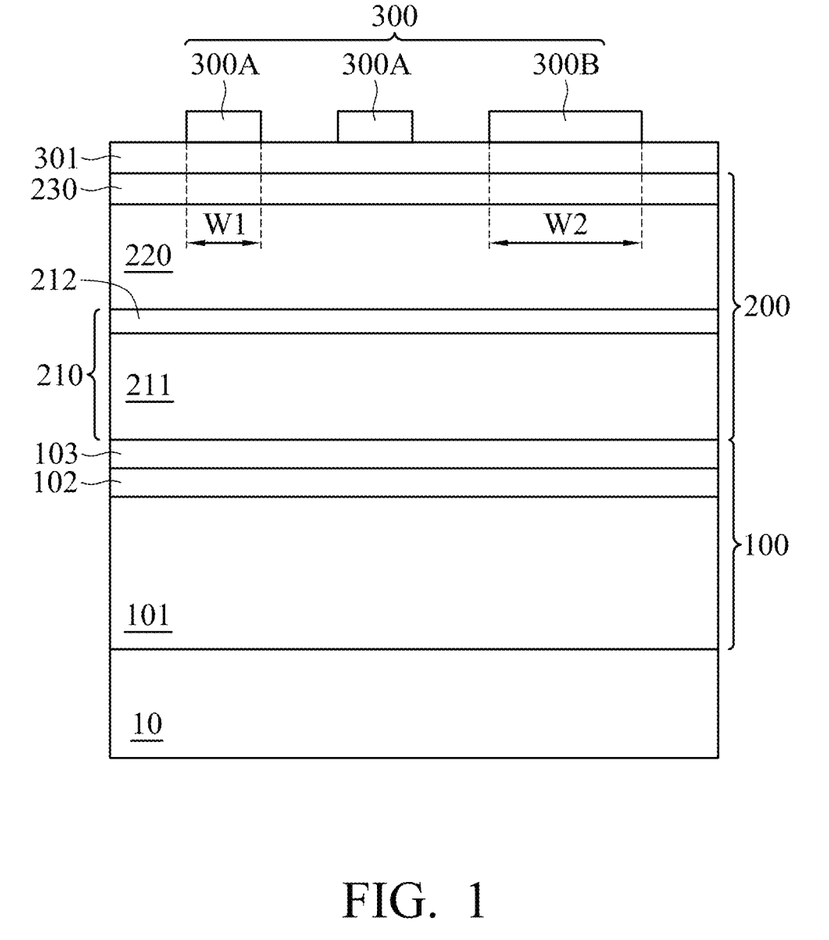
FIGS. 1 to 13 are schematic cross-sectional views showing semiconductor structures formed in each stage according to some embodiments of the disclosure.
Figure 13:
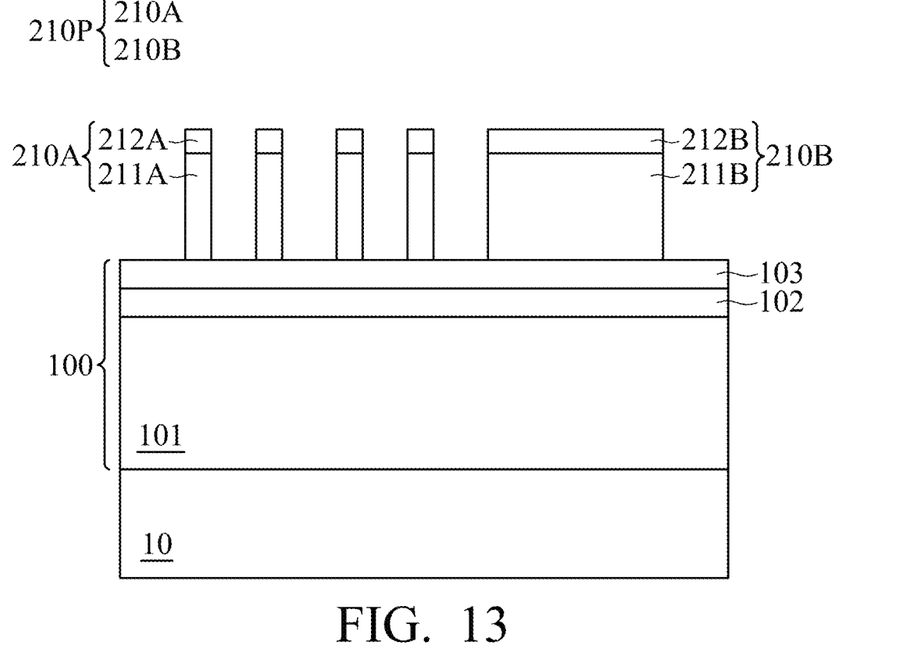
Figure 14:
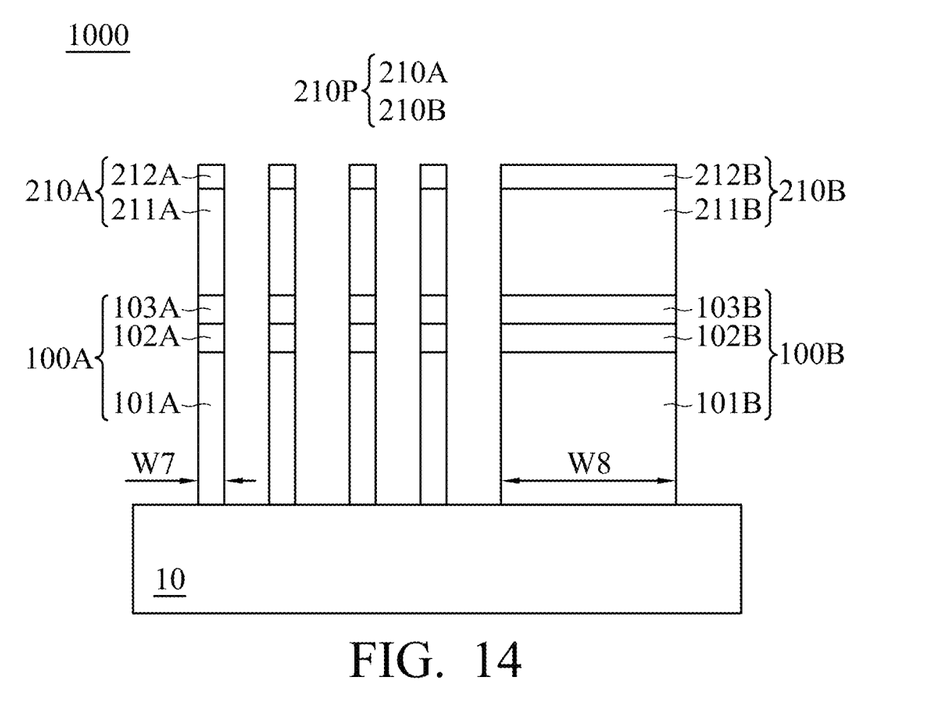
FIG. 14 is schematic cross-sectional view showing a semiconductor structure according to some embodiments of the disclosure.

FIGS. 1 to 13 are schematic cross-sectional views illustrating a semiconductor structure 1000 shown in FIG. 14 in each stage according to some embodiments of the disclosure. Referring to FIG. 1, a target layer 100 is formed on a substrate 10, a hard mask stack 200 is formed on the target layer 100, and an anti-reflective layer 301 and a patterned photoresist layer 300 are sequentially formed on the hard mask stack 200. The target layer 100 includes a gate layer 101, a conductive material layer 102 formed on the gate layer 101, and a capping layer 103 formed on the conductive material layer 102. The hard mask stack 200 includes a first hard mask layer 210, a second hard mask layer 220, and a third hard mask layer 230 sequentially formed on the target layer 100. The patterned photoresist layer 300 formed on the third hard mask layer 230 includes a narrow photoresist pattern 300A having a width W1 and a wide photoresist pattern 300B having a width W2.

According to some embodiments, target layer 100 may form on the semiconductor substrate 10 including a tunneling oxide layer and a floating gate structure. It should be understood that components in the semiconductor substrate are not be shown herein for clearly describing some of the embodiments of the disclosure and emphasizing technical features of the disclosure.

In some embodiments, the substrate 10 may be an elemental semiconductor including silicon or germanium; a compound semiconductor including gallium nitride (GaN), silicon carbide, gallium arsenide, gallium phosphide, indium phosphide, indium arsenide and/or indium antimonide. In other embodiments, substrate 10 may also be a semiconductor on insulator substrate, and the above mentioned semiconductor on insulator substrate may include a bottom plate, an embed oxide layer disposed on the bottom plate, and a semiconductor layer disposed on the embed oxide layer.

In some embodiments, the gate layer 101 of the target layer 100 may be made of a conductive material, such as a polysilicon, a metal or a metal oxide. The conductive material layer 102 on the gate layer 101 may include tungsten (W), tungsten nitride (WN), other suitable conductive materials, or combinations thereof. In some embodiments, the capping layer 103 on the conductive material layer 102 may include a nitride, such as silicon nitride (SiN).

Referring to FIG. 1 again, the first hard mask 210 includes an oxide layer 211 formed on the target layer 100 and a nitride layer 212 formed on the oxide layer 211. In some embodiments, the oxide layer 211 may be made of, for example, silicon oxide formed by tetraethyl orthosilicate (TEOS) or other suitable oxide. A material of the nitride layer 212 includes silicon nitride (SiN), silicon oxynitride (SiON), titanium nitride (TiN), tantalum nitride (TaN) or others suitable nitrides. In some embodiments, the second hard mask layer 220 may be made of the tetraethyl orthosilicate (TEOS) oxide. The third hard mask layer 230 may be made of a polysilicon. In some embodiments, the anti-reflective layer 301 formed on the third hard mask layer 230 may include, for example, spin-on carbon, silicon oxynitride (SiON), other suitable anti-reflective material or combinations thereof.

It should be understood that some of the embodiments use a difference of etching selectivity between the first hard mask 210, the second hard mask layer 220 and the third mask layer 230 to etch a specific layer in subsequent etching processes (details are described hereinafter). Therefore, materials of various layers in the hard mask stack 200 described herein are only illustrative, and the materials may be a suitable mask material depending on process parameters. The embodiments are not limited thereof.

According to some embodiments, the patterned photoresist layer 300 may be formed by coating a photoresist on the anti-reflective layer 301 by using a spin coating process and exposing the photoresist with suitable photomask, in order to form the patterned photoresist layer 300 including the narrow photoresist pattern 300A and the wide photoresist pattern 300B. In some embodiments, the width W1 of the narrow photoresist pattern 300A may be range in 0.045 micrometers (um) to 0.055 um, and the width W2 of the wide photoresist pattern 300B may be range in 0.1 um to 5 um.

Figure 2:
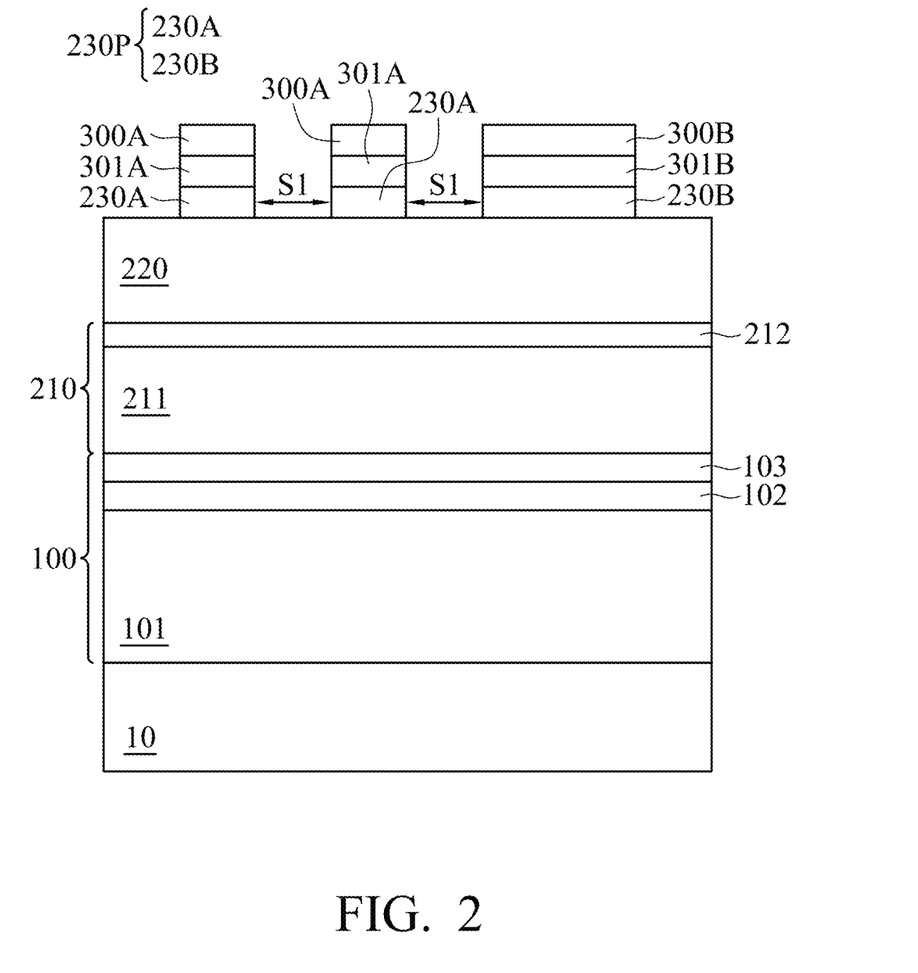

Referring to FIG. 2, patterns (that is the narrow photoresist pattern 300A and the wide photoresist pattern 300B) of the patterned photoresist layer 300 are transferred to the anti-reflective layer 301 and the third hard mask layer 230 there below by an etching process, in order to form patterned anti-reflective layers 301A and 301B and a patterned third hard mask 230P including a plurality of third narrow masks 230A and a third wide mask 230B. Widths of the formed third narrow mask 230A and the formed third wide mask 230B are substantially the same as the width W1 of the narrow photoresist pattern 300A and the width W2 of the wide photoresist pattern 300B, respectively. In some embodiments, a first spacing S1 between neighboring third narrow masks 230A or the third narrow mask 230A and the third wide mask 230B is within a range of 0.045 um to 0.055 um.

Figure 3:
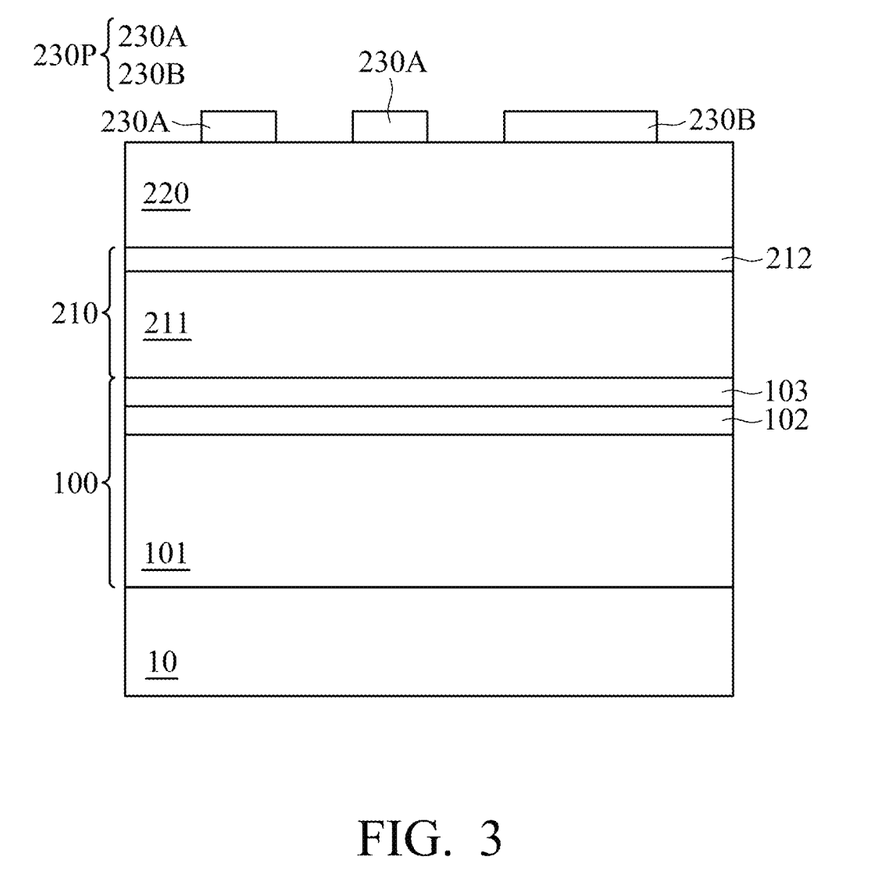

Referring to FIG. 3, for example, an ashing process and/or a wet strip process may be used to remove the patterned photoresist layer 300 and the patterned anti-reflective layers 301A and 301B and remain the plurality of third narrow mask 230A and the third wide mask 230B on the second hard mask layer 220.

Figure 4:
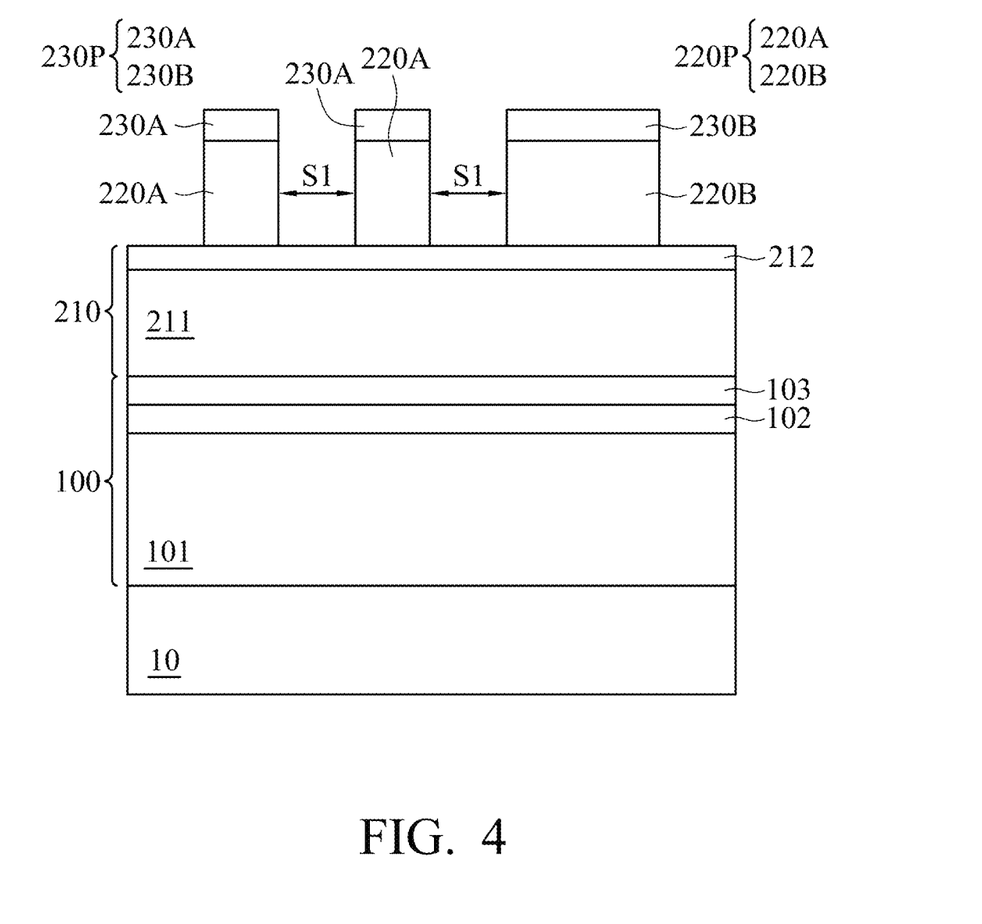

Referring to FIG. 4, the second hard mask layer 220 is etched with an etching mask that is the patterned third hard mask 230P including the third narrow masks 230A and the third wide mask 230B, in order to form a patterned second hard mask 220P located under the patterned third hard mask 230P. As shown in FIG. 4, the patterned second hard mask 220P includes a plurality of second narrow masks 220A and a second wide mask 220B, wherein the second narrow mask 220A is defined by the third narrow mask 230A and the second wide mask 220B is defined by third wide mask 230B. In some embodiments, the spacing between neighboring second narrow masks 220A or the second narrow mask 220A and the second wide mask 220B is substantially the same as the first spacing S1.

Figure 5:
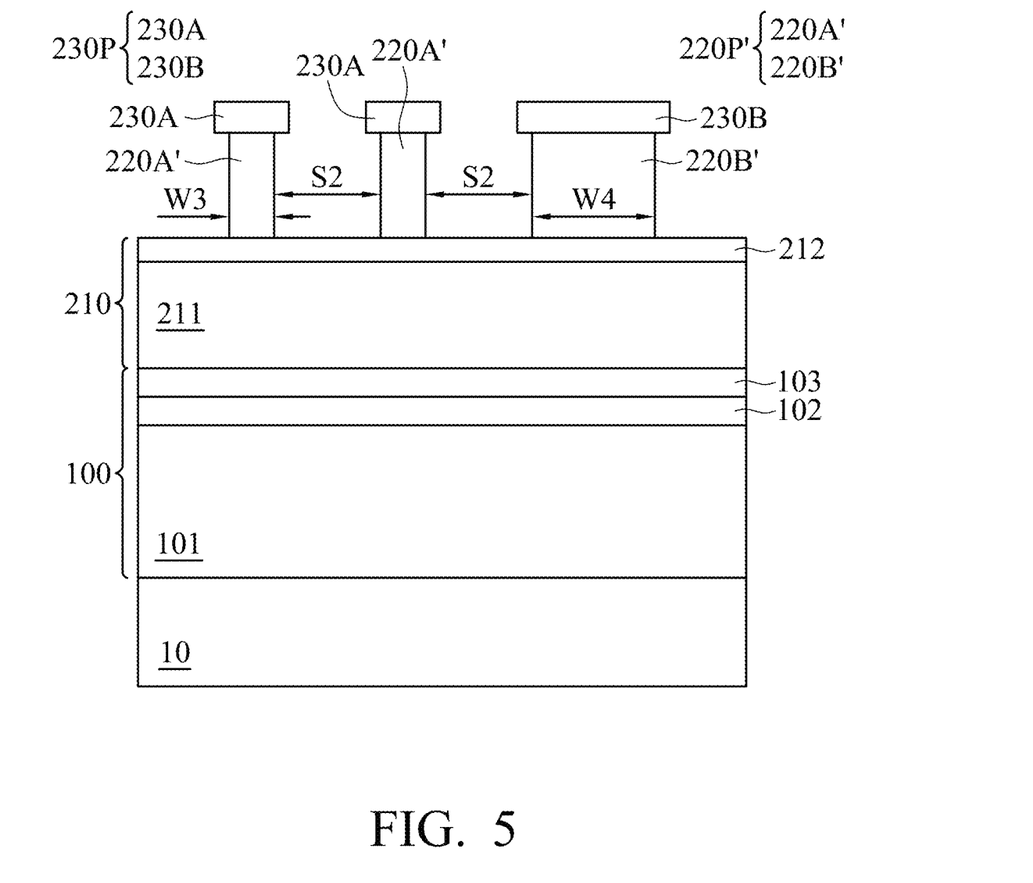

Referring to FIG. 5, the patterned second hard mask 220P are laterally etched to form a narrowed patterned second hard mask 220P' and increase the first spacing S1 between neighboring second narrow masks 220A or the second narrow mask 220A and the second wide mask 220B to a second spacing S2. In some embodiments, the narrowed patterned second hard mask 220P' includes narrowed second narrow masks 220A' and a narrowed second wide mask 220B', wherein a width W3 of the narrowed second narrow mask 220A' may be range in 0.02 um to 0.05 um an a width W4 of the narrowed second wide mask 220B' may be range in 0.075 um to 4.995 um, and the second spacing S2 may be range in 0.05 um to 0.07 um. According to some embodiments, a spacing of a subsequently formed word line structures in a flash memory may be adjusted by narrowing the patterned second hard mask 220P. In particular, the narrower a width of the narrowed patterned second hard mask 220P', the narrower a spacing of the subsequently formed word line structures.

According to some embodiments, the above-mentioned step of laterally etching the patterned second hard mask 220P may be performed by a wet etching process.

Figure 6:
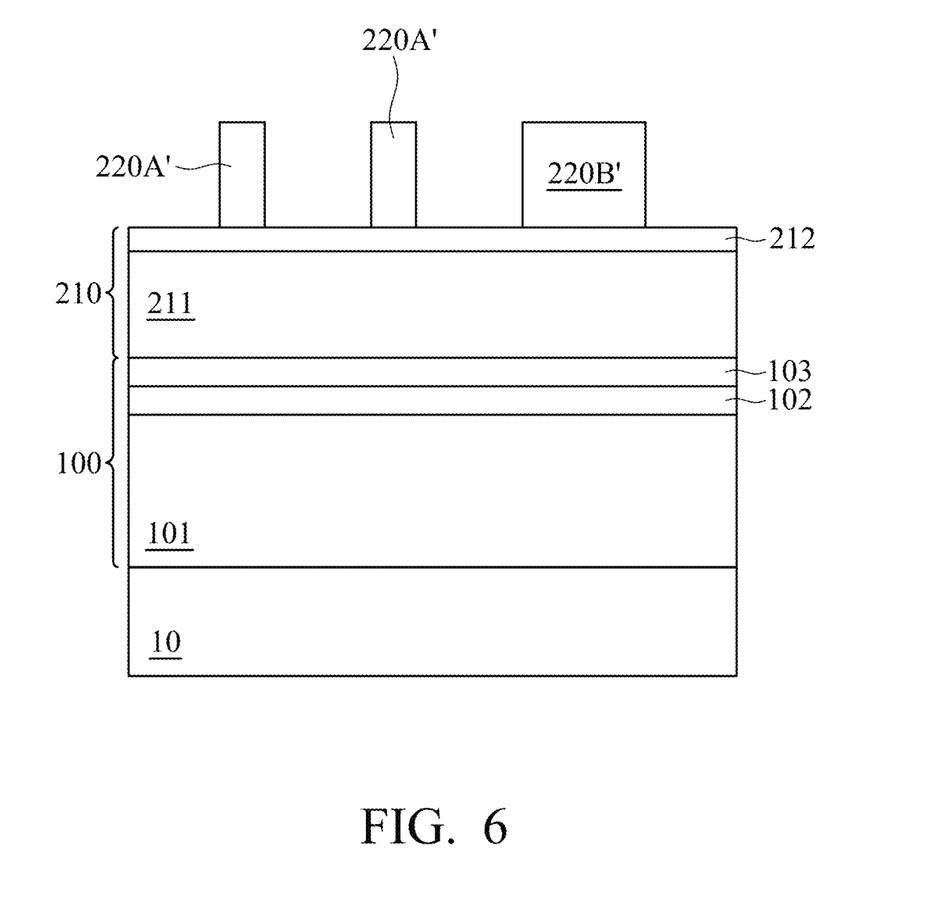

Referring to FIG. 6, the patterned third hard mask 230P including the third narrow masks 230A and the third wide mask 230B is removed from a top surface of the narrowed patterned second hard mask 220P' by an etching process.

Figure 7:
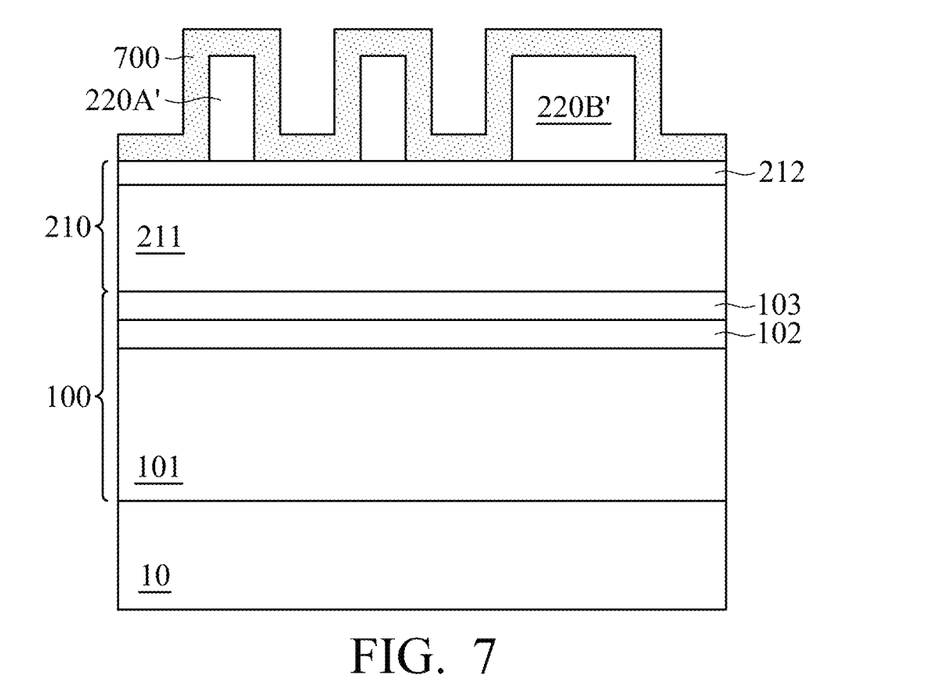

Referring to FIG. 7, a spacer material layer 700 is deposited on the narrowed second narrow masks 220A' and the narrowed second wide mask 220B'. In particular, the spacer material layer 700 covers a top surface of the first hard mask layer 210 and sidewalls and top surfaces of the narrowed second narrow masks 220A' and narrowed second wide mask 220B'. In some embodiments, the spacer material layer 700 may include polysilicon.

Figure 8:
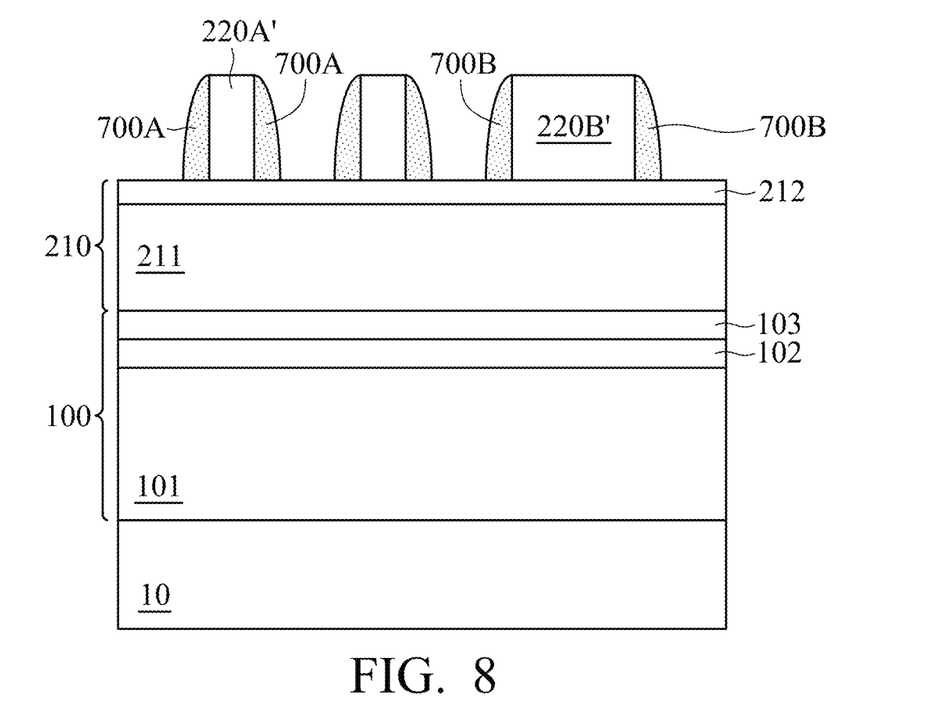

Referring to FIG. 8, a part of the spacer material layer 700 is etched to form a plurality of spacers 700A covering the narrowed second narrow masks 220A' and a plurality of spacers 700B covering the narrowed second wide mask 220B' and expose top surfaces of the narrowed second narrow masks 220A' and the narrowed second wide mask 220B'. According to some embodiments, widths of the spacers 700A and 700B are substantially the same and are range in 0.012 um to 0.027 um. In some embodiments, a width of the subsequently formed word line structure may be adjusted by adjusting the widths of the spacers 700A and 700B, to comply with a product requirement. Details are described hereinafter.

Figure 9:
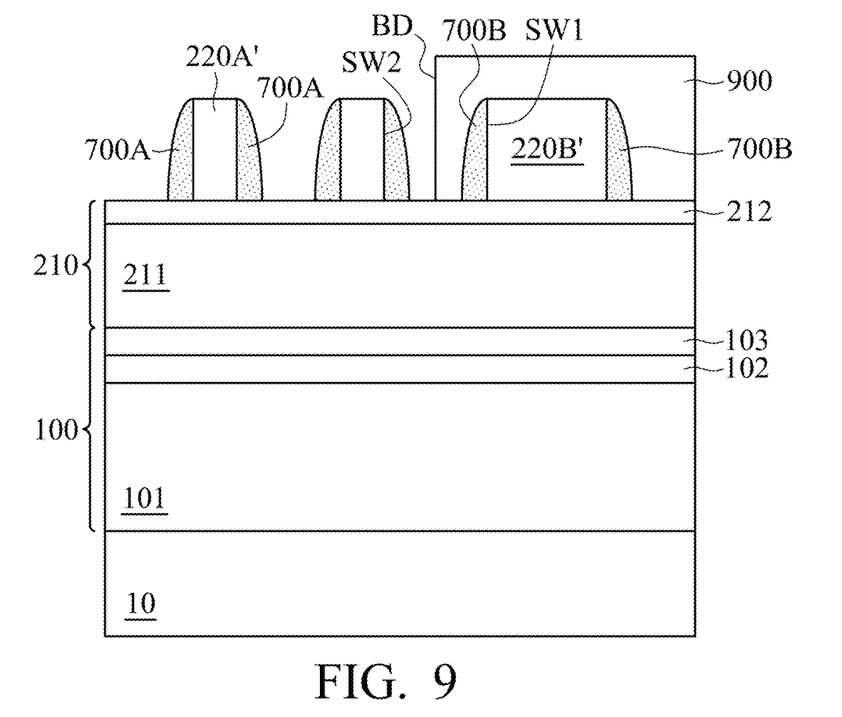

Referring to FIG. 9, a photoresist layer 900 is formed to cover the narrowed second wide mask 220B'. According to some embodiments, a boundary BD (or sidewall) of the photoresist layer 900 may be located between the sidewall SW1 of the narrowed second wide mask 220B' and the sidewall SW2 of the adjacent narrowed second narrow mask 220A'. In other words, in some embodiments, the photoresist layer 900 covering the narrowed second wide mask 220B' and the spacer 700B does not cover the narrowed second narrow masks 220A' for a benefit of removing the narrowed second narrow masks 220A' in the subsequent etching process. For example, according to some embodiments, FIG. 9 shows that the photoresist layer 900 covers a top surface of the narrowed second wide mask 220B' and covers side surfaces of a pair of spacer 700B formed on the sidewalls of the narrowed second wide mask 220B'. Accordingly, compared to a case where the photoresist layer directly forms between the spacers without mask (that is without the second wide mask 220B') therebetween and only uses the photoresist layer and the spacers as a etching mask in the subsequent etching process, the embodiments provided in the present invention may effectively improve a tolerance of a process for forming the photoresist layer 900.

Figure 10:
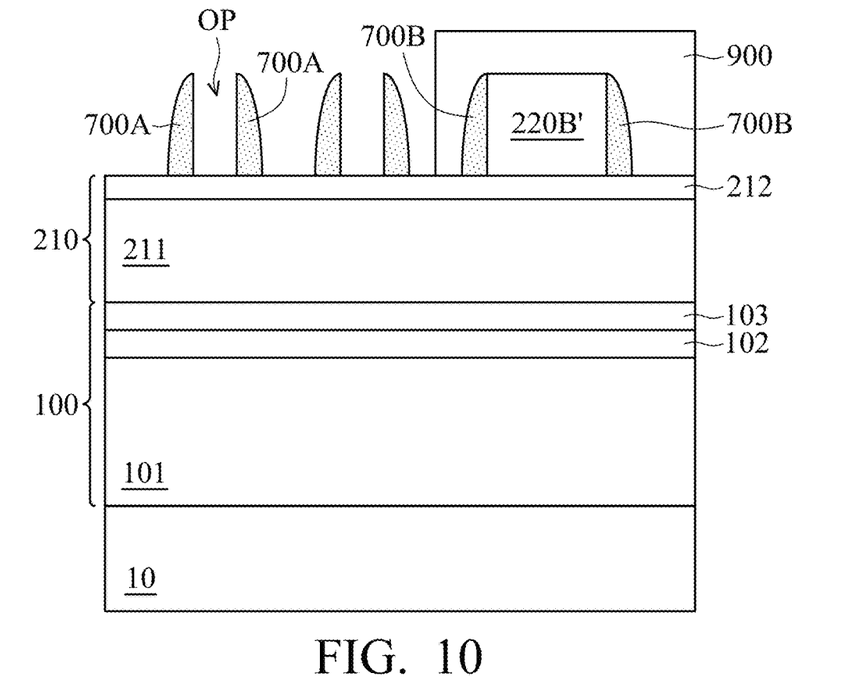

Referring to FIG. 10, the narrowed second wide mask 220B' is covered by the formed photoresist layer 900, and the narrowed second narrow masks 220A' located between the spacers 700A are removed by an etching process. In some embodiments, after removing the narrowed second narrow masks 220A', openings OP are formed between the spacers 700A, wherein a top portion of the first hard mask layer 210 (for example, the nitride layer 212) located between the spacers 700A is exposed by the openings OP.

Figure 11:
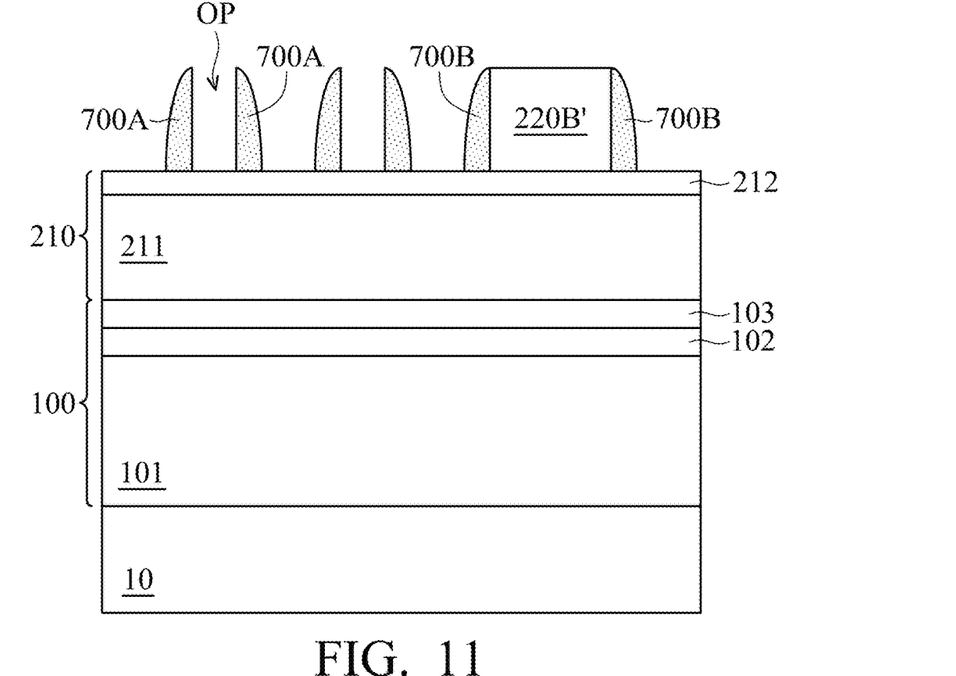

Referring to FIG. 11, for example, the photoresist layer 900 is removed by an ashing process and/or a wet strip process and the plurality of spacers 700A, the narrowed second wide mask 220B', and the pair of spacers 700B covering the sidewalls of the narrowed second wide mask 220B' together as an etching mask in an subsequent etching process are remained.

Figure 12:
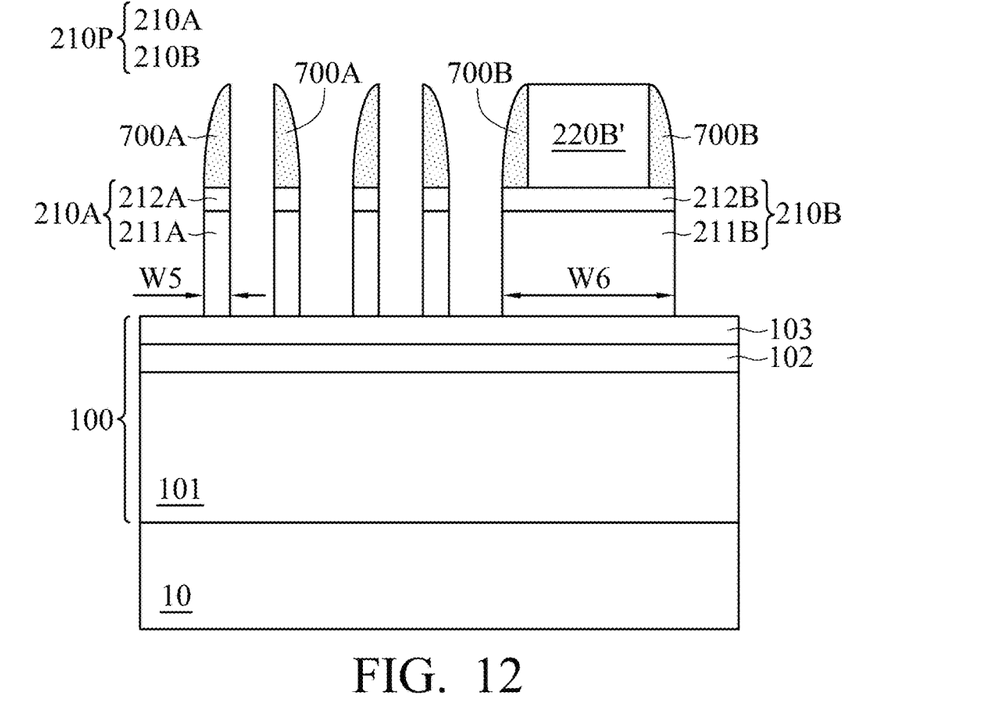

Referring to FIG. 12, the first hard mask layer 210 is etched (for example, by a dry etching such as a reactive ion etching (RIE)) with the spacers 700A, the narrowed second wide mask 220B', and the pair of spacers 700B covering the sidewalls of the narrowed second wide mask 220B' together as an etching mask to form a plurality of patterned first hard mask layers 210P on the target layer 100. According to some embodiments, the spacers 700A may be used to define a first line width (for example, a width of the word line structure (a width W7 shown in FIG. 14)), and the narrowed second wide mask 220B' and the pair of spacers 700B covering the sidewalls of the narrowed second wide mask are used together to define a second line width (for example, a width of the select gate structure (a width W8 shown in FIG. 14)).

According to some embodiment, compared to a case where a mask having a thickness larger than the spacers is formed between the spacers and is together as an etching mask with the spacers, a scatter of a ion beam during a etching process may be effectively avoided by using the narrowed second wide mask 220B', the spacers 700B and the spacers 700A together as an etching mask since the top surfaces of the narrowed second wide mask 220B' and top surfaces of the spacers 700B covering the sidewalls of the narrowed second wide mask 220B' do not have a height drop in the embodiments. And then, the patterned first hard mask layer 210P below is prevented from being skewed.

Referring to FIG. 12 again, the patterned first hard mask layer 210P includes a first narrow mask 210A defined by the spacers 700A and a first wide mask 210B defined by the narrowed second wide mask 220B' and the pair of spacers 700B covering the sidewalls of the narrowed second wide mask 220B'. The first narrow mask 210A includes a patterned oxide layer 211A formed on a top surface of the target layer 100 (for example, a top surface of the capping layer 103) and a patterned nitride layer 212A formed on the patterned oxide layer 211A. The first wide mask 210B includes a patterned oxide layer 211B formed on the top surface of the target layer 100 (for example, the top surface of the capping layer 103) and a patterned nitride layer 212B formed on the patterned oxide layer 211B.

According to some embodiments, a width W5 of the first narrow mask 210A is substantially the same as the width of the spacers 700A, and a width W6 of the first wide mask 210B is substantially the same as the sum of the narrowed second wide mask 220B' and widths of the pair of spacers 700B covering the sidewalls of the narrowed second wide mask 220B'. In particular, the width W5 is within a range of 0.012 um to 0.027 um, and the width W6 is within a range of 0.09 um to 5.045 um.

Referring to FIG. 13, the spacers 700A, the narrowed second wide mask 220B' and the spacers 700B covering the sidewalls of the narrowed second wide mask 220B' are removed by an etching process, and the patterned first hard mask layer 210P on the top surface of the target layer 100 as an etching mask in an subsequent etching process is remained.

Referring to FIG. 14, patterns (that is patterns of the plurality of first narrow mask 210A and the first wide mask 210B) formed on the target layer are transferred to the target layer. In some embodiments, the first narrow mask 210A is used to define a patterned target layer 100A in the target layer 100, and the first wide mask 210B is used to define a patterned target layer 100B in the target layer 100. According to some embodiments, the patterned target layer 100A of the semiconductor structure 1000 may be used to from the word line structures in the flash memory device (not shown), wherein the word line structure includes a patterned gate layer 101A, a patterned conductive material layer 102A and a patterned capping layer 103A sequentially stacked. The patterned target layer 100B of the semiconductor structure 1000 may be used to from the select gate structure in the flash memory device (not shown), wherein the select gate structure includes a patterned gate layer 101B, a patterned conductive material layer 102B and a patterned capping layer 103B sequentially stacked.

Referring to FIG. 14 again, in some embodiments, the semiconductor structure 1000 serving as the flash memory device includes the patterned target layer 100A and the patterned target layer 100B. The width W7 of the patterned target layer 100A (or referred as the word line structure) of the semiconductor structure 1000 is substantially the same as the width W5 of the first narrow mask 210A. The width W8 of the patterned target layer 100B (or referred as the select gate structure) is substantially the same as the width W6 of the first wide mask 210B. According to some embodiments, after forming the patterned target layer 100A (the word line structure) and the patterned target layer 100B (the select gate structure), the patterned first hard mask layer 210P (not shown) may be removed by an etching process.

As described above, the method for forming the semiconductor structure provided in the embodiments of the disclosure includes: removing narrow hard mask therebetween after forming the plurality of spacers between the sidewalls of the patterned hard mask; and making the formed spacers (for example, the spacers 700A and 700B) and remained wide hard mask (for example, the narrowed second wide mask 220B') together as the etching mask. Without forming an additional photomask having a small line width, the above-mentioned spacers may be used to define a component structure having a smaller width (for example, the word line structure) in the target layer under the patterned hard mask, and the above-mentioned remained wide hard mask and the pair of spacers formed on the sidewalls of the remained wide hard mask may be together used to define a component structure having a larger width (for example, the select gate structure in the flash memory device) in the target layer. Therefore, the method for forming the semiconductor structure provided in the embodiments may effectively reduce the process difficulty and process cost.

According to some embodiments, after the word line structures and the select gate structure are formed by the above-mentioned method for forming the semiconductor structure, the word line structures may be combined with the floating gate structure and the tunnel oxide layer in the semiconductor substrate below into a memory cell, and the select gate structure may be combined with a source and a drain subsequently formed on both sides of the semiconductor substrate into a select gate transistor. Also, others semiconductor processes may be subsequently preformed to form the flash memory device.

Several embodiments are generally described above so that a person of ordinary skill in the art may understand thoroughly views of the embodiments of the disclosure. A person of ordinary skill in the art should understand that other processes and structures are designed or modified based on the embodiments of the disclosure, in order to achieve the same purposes and/or advantages as the embodiments described herein. A person of ordinary skill in the art should also understand that such equivalent processes and structures do not depart from the spirit and the scope of the disclosure and may be variously changed, substituted and replaced without departing from the spirit and the scope of the disclosure.

What is claimed is:
1. A method for forming a semiconductor structure, comprising:

forming a target layer on a substrate;

forming a hard mask stack on the target layer, wherein the hard mask stack comprises a first hard mask layer, a second hard mask layer and a third hard mask layer sequentially formed on the target layer;

patterning the third hard mask layer to form a plurality of patterned third hard masks;

patterning the second hard mask layer to form a plurality of patterned second hard masks, wherein the plurality of patterned second hard masks comprise a second wide mask and second narrow masks;

performing a wet etching process to laterally etch the plurality of patterned second hard masks while keeping the plurality of patterned third hard masks on the plurality of patterned second hard masks, in order to increase a first spacing between neighboring second narrow masks or second narrow mask and second wide mask to a second spacing;

removing the plurality of patterned third hard masks after performing the wet etching process;

forming a plurality of spacers on sidewalls of the second wide mask and the second narrow masks;

forming a photoresist layer to cover a top surface of the second wide mask, and the photoresist layer covers side surfaces of a pair of spacers on the sidewalls of the second wide mask, and performing an etching process to remove the second narrow masks between the plurality of spacers; and removing the photoresist layer, then etching the first hard mask layer with the plurality of spacers and the second wide mask together as an etching mask to form a plurality of patterned first hard masks on the target layer, wherein the plurality of spacers are used to define a first line width, and the second wide mask and the pair of spacers formed on the sidewalls of the second wide mask are used together to define a second line width.

2. The method as claimed in claim 1, further comprising: before the patterning the patterned photoresist layer, forming an anti-reflective layer on the third hard mask layer.

3. The method as claimed in claim 1, wherein the formation of the plurality of spacers on sidewalls of the second wide mask and the second narrow masks comprises:

depositing a spacer material layer on the second wide mask and the second narrow masks; and etching back the spacer material layer to form the plurality of spacers covering the sidewalls of the second wide mask and the second narrow masks and exposing top surfaces of the second wide mask and the second narrow masks.

4. The method as claimed in claim 1, wherein:

a boundary of the photoresist layer is located between the sidewall of the second wide mask and the sidewall of the adjacent second narrow mask.

5. The method as claimed in claim 1, wherein the plurality of patterned first hard masks formed on the target layer comprises a first wide mask and a plurality of first narrow masks, a width of the first wide mask is substantially the same as a sum of a width of the second wide mask and widths of the pair of spacers covering the sidewalls of the second wide mask, and a width of the first narrow mask is substantially the same as a width of the spacer.

6. The method as claimed in claim 5, further comprising:

transferring patterns of the plurality of patterned first hard masks formed on the target layer to the target layer, wherein the first wide mask is used to define a select gate structure in the target layer, and the plurality of first narrow masks is used to define a plurality of word line structures in the target layer.

7. The method as claimed in claim 1, wherein:

the target layer comprises a gate layer, a conductive material layer and a capping layer sequentially stacked.

8. The method as claimed in claim 1, wherein the formation of the first hard mask layer comprises:

forming an oxide layer on the target layer; and forming a nitride layer on the oxide layer, wherein the oxide layer and the nitride layer constitutes the first hard mask layer.

9. The method as claimed in claim 1, wherein the second hard mask comprises an oxide layer.

10. The method as claimed in claim 1, wherein the third hard mask comprises a polysilicon layer.

* * * * *